(12) United States Patent
Guo et al.

(10) Patent No.: US 8,082,130 B2
(45) Date of Patent: Dec. 20, 2011

(54) METHOD AND CALCULATOR FOR MODELING NON-EQUILIBRIUM SPIN POLARIZED CHARGE TRANSPORT IN NANO-STRUCTURES

(75) Inventors: Hong Guo, Brossard (CA); Derek Waldron, Montreal (CA); Brian Larade, Montreal (CA)

(73) Assignee: The Royal Institution for the Advancement of Learning/McGill University, Montreal (CA)

( * ) Notice: Subject to any disclaimer, the term of this patent is extended or adjusted under 35 U.S.C. 154(b) by 689 days.

(21) Appl. No.: 12/015,133

(22) Filed: Jan. 16, 2008

(65) Prior Publication Data

US 2008/0170338 A1    Jul. 17, 2008

Related U.S. Application Data

(60) Provisional application No. 60/885,056, filed on Jan. 16, 2007.

(51) Int. Cl.
*G06F 17/10*    (2006.01)
(52) U.S. Cl. .......................................................... 703/2
(58) Field of Classification Search ........................ 703/2
See application file for complete search history.

(56) References Cited

U.S. PATENT DOCUMENTS

2008/0059547 A1 * 3/2008 Taylor ........................... 708/290

OTHER PUBLICATIONS

W.J. Gallagher et al., Developement of the magnetic tunnel junction MRAM at IBM: from first junctions to a 16-Mb MRAM demonstrator chip;IBM Res. & Dev., vol. 50, 5-23A (2006).

K. Tsukagoshi et al.,Coherent transport of electron spin in a ferromagnetically contacted carbon nanotube; Nature, 401, 572 (1999).
Z.H. Xiong et al., Giant magnetoresistance in organic spin-values: Nature, 427, 821 (2004).
J.R. Petta et al., Spin-Dependent Transport in Molecular Tunnel Junctions: Phys. Rev. Lett. 93, 136601 (2004).
S.S.P. Parkin et al., Giant tunnelling magnetoresistance at room temperature with MgO (100) tunnel barriers: Nature Materials, 3, 862 (2004).
S. Yuasa et al.,Giant room-temperature magnetoresistance in single-crystal Fe/MgO/Fe magnetic tunnel junctions: Nature Materials, 3, 869 (2004).
H. Mehrez et. al., Carbone Nanotube based magnetic tunnel junctions: Phys. Rev. Lett. 84, 2682(2000).
S. Krompiewski et al., Giant magnetoresistance of multiwall carbon nanotues:Modeling the tube/ferromagnetic-electrode burying contact: Phys. Rev. B 69, 155423 (2004).
E.G. Emberly et al.,Molecular spintronics: spin-dependent electron transport in molecular wires: Chem. Phys. 281, 311(2002).
W.H. Butler et al., Spin-Dependent tunneling conductance of Fe/MgO/Fe sandwiches: Phys. Rev. B 63, 054416 (2001).

(Continued)

*Primary Examiner* — Paul Rodriguez
*Assistant Examiner* — Andre Pierre Louis
(74) *Attorney, Agent, or Firm* — Goudreau Gage Dubuc; Gwendoline Bruneau

(57) ABSTRACT

A method and calculator for obtaining spin polarized quantum transport in 3-dimensional atom-scale spintronic (spin electronics) devices under finite bias voltage, based on implementing Density Function Theory (DFT) in combination with the Keldysh non-equilibrium Greens function (NEGF) formalism to calculate spin polarized quantum transport in 3-dimensional nanostructures under finite bias and external voltage.

7 Claims, 7 Drawing Sheets

OTHER PUBLICATIONS

C. Zhang et al., Electronic structure and spin-dependent tunneling conductance under a finite bias; Phys. Rev. B 69, 134406 (2004).
J.M. MacLaren et.al., Layer KKR approach to Bloch-wave transmission and reflection:applicaiton to spin-dependent tunneling; Phys. Rev. B 59, 5470 (1999).
K.M. Schep, et al., Interface resistances of magnetic multilayers; Phys. Rev. B 56, 10805 (1997).
K. Xia, et al., Interface resistance of disordered magnetic multilayers Phys. Rev. B 63, 064407 (2001).
W. Butler, A signal boost is in order; Nature Materials, 3, 845 (2004).
M. Coey, Thin skins for magnetic sensitivity; Nature Materials, 4, 9(2005).
D. Waldron et al., Nonlinear Spin Current and Magnetoresistance of Molecular Tunnel Junctions; Phys. Rev. Lett. 96, 166804 (2006).
D. Waldron et al., First Principles Modeling of Tunnel Magnetoresistance of Fe/MgO/Fe Trilayers; Phys. Rev. Lett. 97, 226802 (2006).
J. Taylor et al., Ab initio modeling of open systmes: Charge transfer, electron conduction, and molecular switching of a C60 device Physical Review B 63, 245407 (2001).
W. Wulfhekel, et al., Single-crystal magnetotunnel junctions; Appl. Phys. Lett. 78, 509 (2001).
D. Waldron et al.,ab initio simulation of magnetic tunnel junctions; Nanotechnology, 18, 424026 (2007).

* cited by examiner

METHOD AND CALCULATOR FOR MODELING NON-EQUILIBRIUM SPIN POLARIZED CHARGE TRANSPORT IN NANO-STRUCTURES

CROSS REFERENCE TO RELATED APPLICATIONS

This application claims priority on U.S. provisional application No. 60/885,056, filed on Jan. 16, 2007. All documents above are herein incorporated by reference.

FIELD OF THE INVENTION

The present invention relates to atomistic quantum transport. More specifically, the present invention is concerned with a method and a calculator for calculating spin polarized quantum transport in 3-dimensional nanoelectronic devices under finite bias voltage. All documents below are herein incorporated by reference.

BACKGROUND OF THE INVENTION

Spin-based electronics is an emerging disruptive technology with enormous potential. A promising application is the field of computer memories, where Magnetoresistive Random Access Memories (MRAM) could replace the present memory technologies.

The rapid progress in the miniaturization of semiconductor electronic devices leads to a degree of integration where quantum effects will take precedence over classical electronic effects. Electron spin being one such quantum effect, Spintronics—short for spin-based electronics—involves devices where both the charge and spin of an electron are used to carry and manipulate information. Applications for spintronics-based devices include Giant Magnetoresistance (GMR), Magnetic Sensors, Magnetoresistive Random Access Memories (MRAM), Spin Transistors and Quantum Computing for example.

GMR represents a quantum technology that was successfully commercialized, with applications in the data storage industry, principally for hard disk drives. Today almost all hard disk drives are based on this technology.

MRAM has the potential to revolutionize and take over the memory market. MRAM technology is based on the use of magnetic moments, rather than on electric charge, to determine the on-off state of the memory bit cell. MRAM combines the best attributes of three major existing memory technologies: density of DRAM (dynamic RAM), the speed of SRAM (static RAM) and the nonvolatility of flash memory.

Magnetic sensors have the potential to be directly fabricated on silicon substrate, leading to highly efficient systems where sensing and logic functions are closely integrated. In spin-based quantum computers that have been conceptually envisioned, the fundamental unit to represent information is quaternary (rather than binary), which opens the door to new computing techniques especially well adapted to deal with non-linear problems and suitable for massively parallel computing applications. Magnetic sensors known as Anisotropic MagnetoResistance (AMR) sensors can be presently manufactured at a reasonable cost, providing arrays of sensors built-in on a silicon substrate. These find applications in magnetic biosensing, non-destructive testing, position sensing, document validation and magnetic imaging. Due to a number of technical shortcomings caused by the AMR effect exploited in these sensors, magnetic tunnel junction (MJT) sensors may progressively replace AMR sensors. Since MRAMs are MJT devices, the development of MJT sensors will be closely tied to the advances made for MRAMs.

As for spin-based transistors and quantum computing, these technologies are still at their infancy, and further research and development are needed before commercial applications become available. Spin-based transistors offer an alternative for smaller energy consumption and faster performance.

It is expected that GMR will continue to be a driving market force for spintronics until MRAM takes off and becomes widely commercially available. In the short term, the hard-disk market is expected to continue to be a primary driver for technological advancement, pulled by a constant need to increase the data storage capacity that leads to devices with increased surface density. With already some initial success for applications in the space and military domains, MRAM is just entering the commercial market. Prototypes of MRAM-based products are presently available and it is expected that commercially viable products will be soon available. Continuous research and development activities in the fields of magnetic device elements, magnetic materials and process integration for magnetic components will allow the technology to further develop and to eventually become widely commercially available. In the long term, MRAM may become a memory for many applications, since it is at the same time nonvolatile, durable, fast and dense, and thus eliminates the need to combine memories of different types. It has the potential to be used for a wide range of applications such as mobile phones, digital cameras, game consoles, personal digital assistants/organizers, personal computers, automobiles, etc.

The broad adoption of spintronics depends on a number of restraining factors that still constitute considerable challenges, at least in the short term. One first such factor relates to the production of semiconductor devices with new materials. Indeed, spintronics do not use the same materials used in conventional semiconductors. Since spintronics devices use magnetism, metallic substrates are usually needed. Materials that find applications in spintronics include nickel, iron, cobalt and their alloys and other compounds. Their use in conjunction with traditional semiconductor materials results in challenges in terms of compatibility, integration, etching, patterning, and production. A second challenging factor is the reliability of spintronics device, which is not demonstrated yet. A third restraining factor might be the fact that MRAMs requires high current for the magnet to switch between states, which causes problem for low-power operation.

Methods that can accurately model performance of modern hard-drives and magnetic memory (MRAM) and aid in the design process and evaluation of future technology have thus become essential. As the devices continue to downsize into the nanoscale limit, currently available modeling methods are no longer adequate or even valid, and new methods are needed to continue to support research and development.

The tunnel magnetoresistance (TMR) effect in systems with spin-polarized transport is emerging as a basic physical principle for near-future information storage technology, magnetic sensor, magnetic random access memory (MRAM), magnetic programmable logic, as well as spintronics (see W. J. Gallagher et al. IBM Res. & Dev., Vol 50. 5-23A (2006)).

TMR devices typically comprise an insulating (I) tunnel barrier separating two ferromagnetic (FM) metal layers in the form of FM-I-FM, as shown in FIG. 1 for example (W. Butler, Nature Materials, 3, 845 (2004)). Crucial to the development of TMR technology is the material and device design automation. At present, since the insulating layer (I) is only a few atomic layers thick, even a few impurities and/or defects may have substantial quantitative influence to device operation. Furthermore, since TMR is a quantum mechanical effect, a proper design automation method should be based on atomistic quantum mechanical first principles. Such a method should be able to predict how spin-polarized charge transport is related to atomic structure, and how TMR depends on external control parameters such as voltage and temperature.

TMR effect will be briefly described in relation to FIG. 1. It is found experimentally that when the magnetic moments of two ferromagnetic layers 1 and 2 are antiparallel (AP), the tunnel resistance $R_{AP}$ across the tunnel barrier is large, i.e. the tunneling current $I_{AP}$ is small; whereas, when the moments are parallel (P), the tunnel resistance $R_P$ is small, i.e. the tunneling current $I_P$ is large. The switching between large and small resistances is therefore achieved by the relative orientation of the magnetic moments in the two FM layers.

For MRAM application, $R_{AP}$ and $R_P$ are used as "1" and "0" in a non-volatile memory device. In information storage or magnetic sensor application, an external magnetic field (from the magnetic bits in a media, for example) flips one of the moments, leading to a change of tunneling current, which is then detected.

An important device parameter is the magneto-resistance ratio, defined by $R_{AP}$ and $R_P$ as: $R=(R_{AP}-R_P)/R_P=(I_P-I_{AP})/I_{AP}$: the greater R, the more sensitive the device becomes, which is desirable. While magnetic tunnel junctions have been studied for many years, it was only very recently that large values of R have been achieved at room temperature, leading to commercial applications of TMR.

FIG. 2 illustrates enhancements of TMR ratio at room temperature, due to the discovery of the MgO tunnel barrier (M. Coey, Nature Materials, 4, 9 (2005)). In addition to oxide barriers, there has been other research on devices where the barrier is a single molecular layer or even a single molecule. These molecular TMR devices include carbon nanotubes (K. Tsukagoshi, B. W. Alphenaar and H. Ago, Nature, 401, 572 (1999).), organic semiconductors (Z. H. Xiong, Di Wu, Z. Valu Vardeny and Jing Shi, Nature, 427, 821 (2004)), and organic molecules (J. R. Petta, S. K. Slater and D. C. Ralph, Phys. Rev. Lett. 93, 136601 (2004)), sandwiched between Ni, Co and Fe materials. The TMR ratio in these molecular devices is typically around 10-20% at present, pointing to substantial room for further improvements.

The rapid progress in TMR technology, as exemplified in FIG. 2, is in part due to better material preparation and control. It is also directly related to an increased understanding of the basic physics of spin polarized quantum transport. Indeed, the theoretical prediction (W. H. Butler et al. Phys. Rev. B 63, 054416 (2001)) of coherent tunneling coupled to symmetry of electron wave function in Fe—MgO interface contributed to the experimental discovery of the large TMR.

In order to rapidly develop TMR technology to large-scale commercialization, an atomistic modeling method of quantum transport is needed for assisting experimental work. This is especially true due to the fact that there still exist many experimental facts that have not been understood. For instance, while theoretical prediction (W. H. Butler et al., Phys. Rev. B 63, 054416 (2001)) of TMR ratio for Fe—MgO—Fe device can be greater than several thousands, experimental results (as exemplified in FIG. 2) are still considerably lower. The reason may be related to the quality of the atomic arrangement at the Fe/MgO interface, the existence or absence of oxygen vacancies and/or other defects. More importantly, much experimental data (S. S. P. Parkin et al. Nature Materials, 3, 862 (2004); S. Yuasa et al., Nature Materials, 3, 869 (2004)) show that the TMR ratio is monotonically decreased by applied bias voltage and reduces to zero when the voltage is about 0.5-1.0 volt. Published theoretical work to date predicted a substantial increase of TMR by bias for systems with asymmetric atomic structure (C. Zhang et al., Phys. Rev. B 69, 134406 (2004)). It is clear that all the modeling methods presented in literature, while useful for academic research, are not capable of making quantitative predictions of spin-polarized quantum transport for practical TMR devices at the atomistic level under nonequilibrium conditions.

Theoretical modeling of spin-polarized transport including atomic and material properties is a very difficult problem.

In DFT, as described in the art, the Hamiltonian operator $\hat{H}$ of a system is determined as a functional of a local electron charge density $\rho(r)$, i.e. $\hat{H}=\hat{H}[\rho(r)]$.

In a transport problem, the system has open boundaries connecting to electrodes and operates under external bias and gate potentials, which drive the device to non-equilibrium: in other words, the environmental-group of the system comprises one or more electrodes and possibly metallic gates and substrates where the device is embedded, and the device-group is the electronic device scattering region, which comprises at least one atom. The charge density $\rho(r)$ is thus to be determined under such conditions. Obtaining $\hat{H}$ and $\rho(r)$ is a self-consistent process, wherein $\hat{H}$ is obtained from $\rho(r)$, and then, using $\hat{H}$, $\rho(r)$ is evaluated, in an iterative process until $\hat{H}$ converges. The nonequilibrium device conditions may be accounted for by using the Keldysh non-equilibrium Green's function (NEGF) for example, to construct $\rho(r)$ from $\hat{H}$.

Indeed, as known in the art, the NEGF-DFT formalism is able to calculate charge density $\rho(r)$ for open quantum device systems under a bias voltage entirely self-consistently without depending on using phenomenological parameter. Since the charge density $\rho$ is constructed from NEGF, the non-equilibrium nature of the device can be handled properly. Atoms in the device scattering region and in the electrodes are treated at equal footing, therefore allowing a realistic electrodes and contacts modeling. NEGF treats the discrete and the continuum parts of the electron spectra at equal footing, so that all electronic states are included properly into the calculation of the device Hamiltonian H.

It is to be noted that NEGF-DFT has already been applied to devices with sizes and complexities no other self-consistent atomistic formalism of the art could handle. However, it still cannot be used for spin polarized charge transport in 3-dimensional magnetic devices.

The existing atomistic modeling methods for TMR devices can be roughly categorized into three classes:

(i) Non-self-consistent tight binding methods can account for some qualitative features of transport, but they depend on semi-empirical parameters thereby having limited predictability (H. Mehrez et. al. Phys. Rev. Lett. 84, 2682 (2000); S. Krompiewski, R. Gutierrez, and G. Cuniberti, Phys. Rev. B 69, 155423 (2004); E. G. Emberly and G. Kirczenow, Chem. Phys. 281, 311 (2002).).

(ii) Layer-KKR method with DFT is a self-consistent method for electronic structure (W. H. Butler et al., Phys. Rev. B 63, 054416 (2001); C. Zhang et al., Phys. Rev. B 69, 134406 (2004); J. M. MacLaren et. al., Phys. Rev. B 59, 5470 (1999)). After DFT is numerically converged, transport properties are computed by applying atomic sphere approximation (ASA). ASA is, in fact, an "art" and the results often depend how it is applied (For example, it has been shown that calculated tunneling conductance of Fe—GaAs interface sensitively depends on how ASA is applied, making quantitative predictions very difficult to make. K. Xia, private communication (2005)). This method has difficulty when there is an external bias voltage, for instance it predicted an increase of TMR ratio rather than the experimentally observed decrease as the bias is increased (C. Zhang et al., Phys. Rev. B 69, 134406 (2004)). Finally, the method requires very large computational time; and it is unclear if a bias and gate voltage can be modeled. This method is limited for application in systems consisting of layers of materials.

(iii) LMTO method has also been successfully applied to investigate TMR systems at zero bias voltage (K. M. Schep, et al., Phys. Rev. B 56, 10805 (1997); K. Xia, et al. Phys. Rev. B 63, 064407 (2001)). It is also based on ASA, and has difficulty in applying to non-space filling situations such as molecular TMR structures. In addition, at present no LMTO methods for TMR device simulation has and can include a bias voltage in the required self-consistent manner. Present implementations of this method can only be applied to bulk materials or layered bulk materials without external bias or gate voltage.

The above existing methods prove to be limited in their application domain. In particular, they have only been applied to bulk systems at zero external potential.

Therefore, there is a need for a state-of-the-art atomistic quantum transport modeling method and associated method that is capable of filling the gap of TMR modeling for industrial applications.

The present description refers to a number of documents, the content of which is herein incorporated by reference in their entirety.

SUMMARY OF THE INVENTION

More specifically, in accordance with the present invention, there is provided a method for calculating spin polarized quantum transport in a 3-dimensional nanoelectronic device under non-equilibrium conditions at finite bias voltage, comprising the steps of: a) self-consistently obtaining the Hamiltonian H of the device using DFT within the standard local spin density approximation for open device structures; b) constructing a non-equilibrium density matrix of the device using Keldysh non equilibrium Green's functions in spin space; and c) calculating spin-dependent transmission coefficients from the Green's functions, wherein step b) comprises a transverse momentum sampling of the Brillouin zone for contribution of each transverse Bloch state in directions perpendicular to the current flow for converging the density matrix There is further provided a method for self-consistently computing non-equilibrium spin resolved density matrix for three-dimensional (3D) magnetic systems consisting of a central scattering region comprising a non-magnetic material, a left and a right magnetic electrodes serving as device leads which connect the device to the outside world, comprising self-consistently calculating the Hamiltonian of each region within DFT in the local spin density approximation and generalized gradient approximation under a potential including an applied bias potential $V_b$ that drives the current flow; whereby the Hamiltonian corresponding to the left and right ferromagnetic electrodes are calculated as isolated bulk material and the $k_\parallel$-dependent retarded self-energies of each lead are determined; and the Hamiltonian corresponding to the central region is calculated self-consistently using the non-equilibrium electron density matrix, calculated over a 2D (in the x-y direction) Brillouin zone for contributions of each transverse Bloch state; and spin currents are calculated by integrating the contributions from each transverse Bloch state.

There is further provided a method for calculating spin polarized quantum transport in a 3-dimensional nanoelectronic device under non-equilibrium conditions at finite bias voltage, comprising the steps of: self-consistently obtaining the Hamiltonian H for an open device using DFT; obtaining the electronic structure of the device by using NEGF to handle the nonequilibrium statistics, and the device transport boundary conditions using a real space numerical technique; and implementing local spin density functional and generalized gradient approximation) for nonequilibrium NEGF-DFT calculation.

There is further provided a computer system for calculation of spin-polarized charge current and spin current transport in magnetic devices; the system comprising a calculator; and a database; wherein the calculator computes the electronic structure of each 3D magnetic electrode of the device using DFT at equilibrium; and stores them in the database; then, the calculator shifts the electrode potential by an amount determined by an external bias voltage; for a first magnetic configuration of the electrodes: i) the calculator constructs a first device Hamiltonian H from a first spin-resolved nonequilibrium density matrix and, using the first H, the calculator computes the NEGF of the scattering region of the device for the first magnetic configuration of the electrodes; ii) from the obtained NEGF, the calculator calculates a second spin-resolved nonequilibrium density matrix; and using the second spin-resolved nonequilibrium density matrix, the calculator constructs a second device Hamiltonian; the calculator repeating steps i) and ii) until the second device Hamiltonian H and the first device Hamiltonian defer by only a pre-specified amount; then the calculator computes transport properties for the device in the first magnetic configuration of the electrodes; and then changes the first magnetic configuration of the electrodes to a second magnetic configuration of the electrodes and starts again.

There is further provided a computer system for calculating spin polarized quantum transport in a 3-dimensional nanoelectronic device under non-equilibrium, comprising: a calculator; a controller; and a storage unit; wherein the calculator, from a periodic atomic structure in 3-dimensional space of each electrode of the device, computes the electronic structure thereof; the storage unit storing the electronic structure; and the controller then shifting the electrode potential by an amount determined by an external bias voltage; for a first magnetic configuration of the electrodes, the calculator constructs a first device Hamiltonian H from a first spin-resolved nonequilibrium density matrix; using the first device Hamiltonian H, the calculator computes the NEGF of a scattering region of the device for the first magnetic configuration of the electrodes; from the obtained NEGF, the calculator obtains a second spin-resolved nonequilibrium density matrix; using the second spin-resolved nonequilibrium density matrix, the calculator constructs a second device Hamiltonian; until the second device Hamiltonian and the first device Hamiltonian defer by a pre-specified amount; and then the calculator computes transport properties transport properties for the device in the first magnetic configuration; then, the controller changes to a second magnetic configuration of the electrodes; and for the second magnetic configuration, the calculator starts again.

Other objects, advantages and features of the present invention will become more apparent upon reading of the following non-restrictive description of specific embodiments thereof, given by way of example only with reference to the accompanying drawings.

DESCRIPTION OF ILLUSTRATIVE EMBODIMENTS

Figure 1:
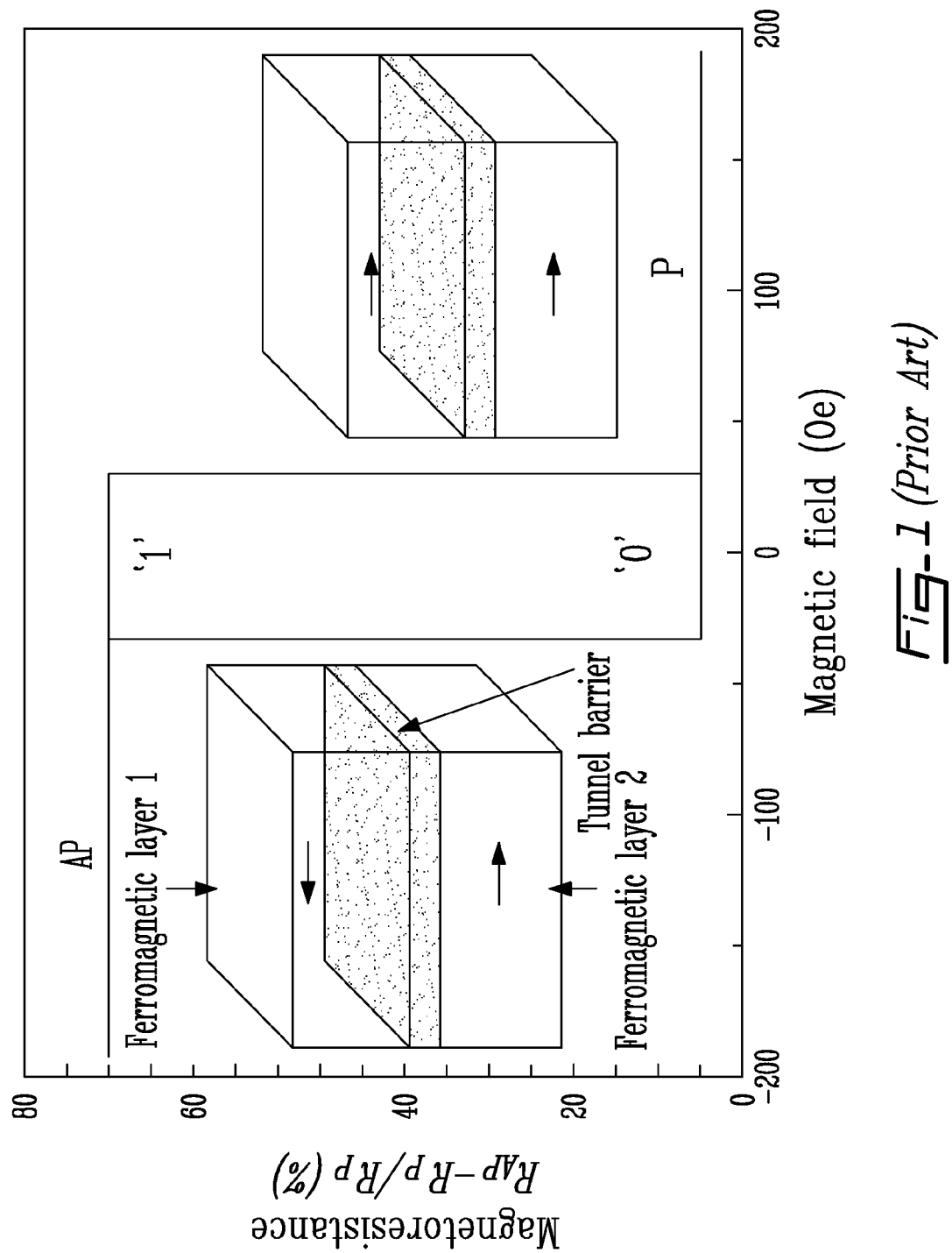
FIG. 1 is a schematic plot of a FM-I-FM TMR device as known in the art.
Figure 2:
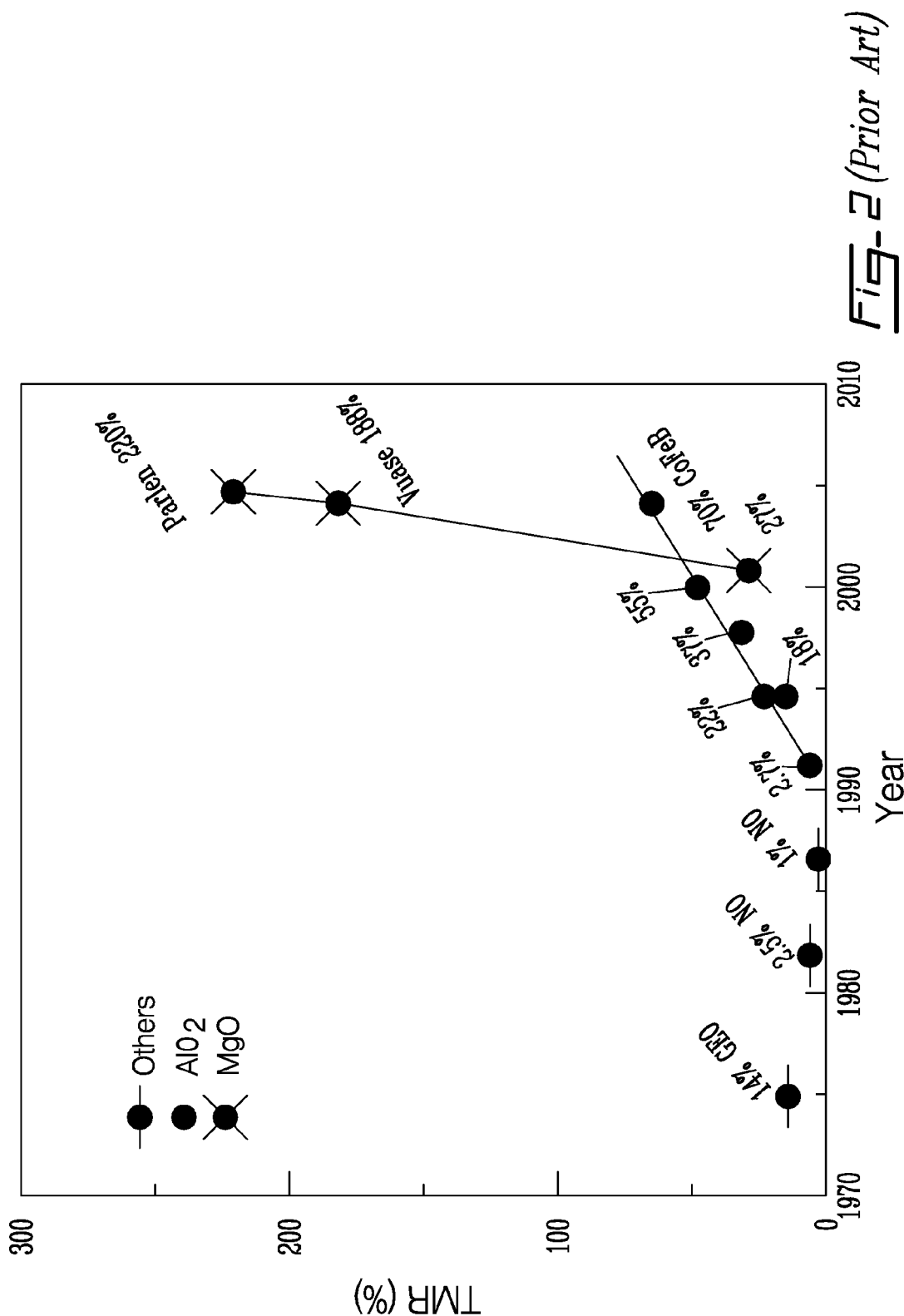
FIG. 2 shows a large TMR ratio at room temperature of MgO based TMR devices.

The present invention is illustrated in further details by the following non-limiting examples.

There is provided a method and a calculator for calculating spin polarized quantum transport in 3-dimensional nanoelectronic devices under finite bias voltage. The method and calculator perform first principles calculations of spin polarized quantum transport in 3-dimensional atomic-scale spintronics (spin electronics) devices under finite bias voltage (externally applied electric field).

Generally stated, the present method and calculator are based on implementing Density Function Theory (DFT) in combination with Keldysh non-equilibrium Green's functions (NEGF) within the Local Spin Density Approximation (LSDA) and Generalized Gradient Approximation (GGA). The local spin-density approximation (LSDA) is a generalization of the local-density approximation (LDA), in which the functional depends only on the density at the coordinate where the functional is evaluated, to include electron spin. Generalized gradient approximations (GGA) are still local but also take into account the gradient of the density at the same coordinate.

In the present method, Keldysh non-equilibrium Green's functions (NEGF) are formulated in spin space so that the non-equilibrium density matrix can be evaluated for different spin channels. Then, in order to obtain the correct bulk as well as surface magnetism (for magnetic materials which serve as the device electrodes) for a magnetic device, careful transverse momentum sampling of the Brillouin zone in directions perpendicular to the current flow is performed for converging the density matrix. Denser k sampling, typically several hundred to a thousand points, and some times up to tens of thousands, is necessary to converge the NEGF.

In the present method, the NEGF-DFT is used to account for the microscopic details of the atomic structure and electronic states at non-equilibrium, as follows. DFT is used to self-consistently calculate the Hamiltonian H of the device. After the device Hamiltonian H is calculated by DFT, the electronic structure of the system is obtained. Quantum transport being a non-equilibrium problem since a current is flowing, one has to populate the electronic structure by proper non-equilibrium statistics, which is accomplished by using NEGF. To deal with the device transport boundary conditions and externally applied bias voltages, a real space numerical technique is needed. The resulting DFT formalism thus allows calculating quantum transport properties of any atomic structure from first principles without any phenomenological parameter. In order to analyze spin-polarized quantum transport in TMR device further, local spin density functional (LSDA) and Generalized Gradient Approximation (GGA) are then incorporated. A difficulty arises from the huge number of Bloch bands (Brillouin zones) in the magnetic layer, which is therefore sampled. Finally, in order to obtain accurate bulk and surface magnetism, the quality of wave function basis sets and pseudo potentials is strictly controlled.

Figure 3:
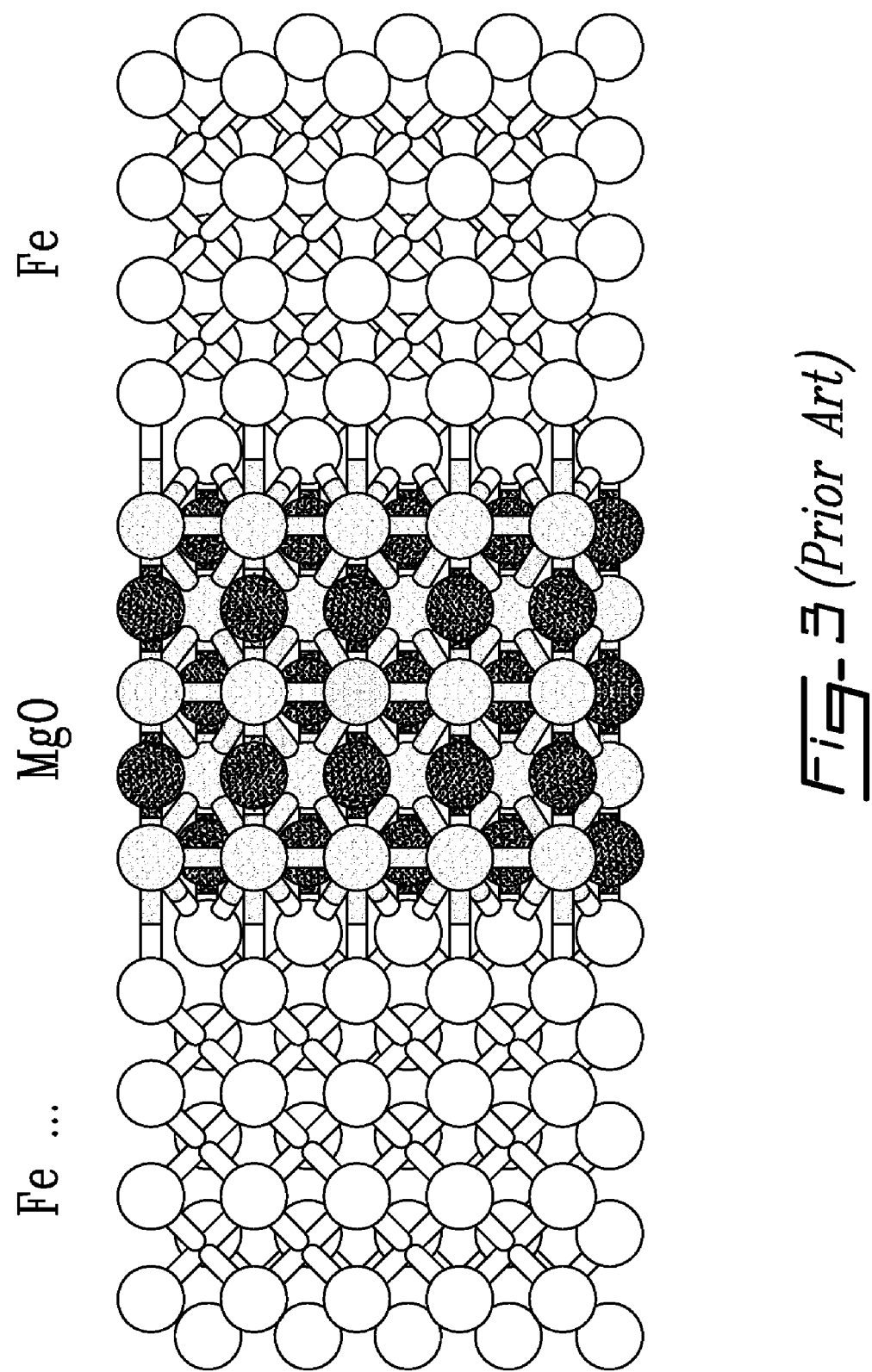
FIG. 3 is a schematic plot of the atomic structure of a Fe/MgO/Fe magnetic tunnel junction (MTJ)

The method and calculator of the present invention are able to self-consistently compute non-equilibrium spin resolved density matrix for three-dimensional (3D) magnetic systems with a two—(as shown in FIG. 3 for example) or multi-probe device setup, so that transport can be calculated for both parallel and anti-parallel magnetization configurations of the contacts of an MNM device, where M stands for magnetic materials (e.g. Fe, Ni, Co, etc) and serves as device leads which connect the MNM device to the outside world; and N stands for non-magnetic materials that can be a metal (e.g. Cu etc), molecules (e.g. carbon nanotubes, organic molecules, etc), semiconductors (e.g. GaAs etc), or insulating materials (e.g. MgO etc).

The present method will be described in relation to a Fe/MgO/Fe magnetic tunnel junction (MTJ) shown in FIG. 3 as an illustration of the kind of magnetic devices of interests.

This magnetic tunnel junction (MTJ) may be characterized as composed of three parts: 1) a central scattering region which consists of MgO layers and a few layers of the Fe atoms on either side of the MgO; 2) a left Fe electrode which extends to $z=-\infty$. In the transverse direction, namely x-y direction, the electrode also extends to infinity so that the Fe form an infinitely large periodic structure; and 3) a right Fe electrode with a similar structure as that of the left electrode.

The left and right electrodes do not have to be the same material.

It is to be noted that for magnetic systems, three-dimensional (3D) leads are necessary to describe both the surface and bulk magnetism of the contacted electrodes realistically.

Along the transport direction (z axis), the two ferromagnetic leads extend to reservoirs at $z=\pm\infty$. The central scattering region is chosen sufficiently large in the z direction such that: (i) the potentials outside the central region are taken as equivalent to bulk and (ii) the central scattering region is sufficiently large such that the matrix elements coupling the left and right leads are zero. The electrochemical potentials of the left and right leads, $\mu_L$ and $\mu_R$, are given by the bulk Fermi level of the ferromagnets that can be calculated by DFT at equilibrium, and the applied external bias voltage.

Because the device is x-y periodic, the Eigenstates of the system can be written in terms of their transverse momentum:

$$\Psi^{k_\|}(R_\|+r)=e^{ik_\|\cdot R_\|}\times e^{ik_\|\cdot r}\cdot\Phi^{k_\|}(r)$$

where $k_\|$ is a Bloch wave vector, $R_\|=n_x a+n_y b$ is a lattice vector, and $\Phi^{k_\|}$ is the x-y periodic Bloch function.

The Keldysh non-equilibrium Green's functions (NEGF) are used to calculate electron density matrix at non-equilibrium and transport properties of the system. In particular, the retarded Green's function in $k_\parallel$ space corresponding to the left-central-right regions of the device is obtained. The coupling of the left and right regions to the remaining part of the semi-infinite electrodes is fully taking into account by the self-energies $$\sum_L^{k_\parallel} \text{ and } \sum_R^{k_\parallel}.$$

To analyze spin-polarized transport, these matrices are extended into spin space. Each matrix element thus becomes a two-by-two matrix, which specifies spin-up, spin-down and the connection between the two spin spaces. There is no restriction of spin colinearity, hence the left and right leads (and possibly any other part of the system) can have arbitrary relative magnetic orientation. For problems such as spin transfer torque, anti-ferromagnet tunnel junction and spin-orbital interaction, the calculation capability of noncolinear spin is important. Below, non-colinearity is not considered and all the formulations below are for colinear systems.

The Hamiltonian of each region is calculated self-consistently within DFT by solving the Kohn-Sham equation:

$$\left[ -\frac{\nabla^2}{2} + \int dr' \frac{\rho(r')}{|r-r'|} + V_{ext}(r) + V_{xc}(r) \right] \Psi(r) = \varepsilon_i \Psi(r)$$

where $\rho(r)$ is the total electron density, $V_{XC}$ is the exchange-correlation functional and $V_{ext}$ is any potential including the pseudopotential that defines the atomic core and the applied bias potential $V_b$ that drives the current flow.

The spin-dependent exchange-correlation potential is treated at the local spin density approximation, where one distinguishes spin-up and spin down densities $\rho^\uparrow$ and $\rho^\downarrow$ and the total density is given by $\rho=\rho^\uparrow+\rho^\downarrow$.

When the central scattering region includes enough layers of the ferromagnetic lead atoms, the electronic structure of the left and right regions can be safely considered as that of bulk, which can be calculated with a supercell DFT analysis. In other words, the parts of the Hamiltonian corresponding to the left and right ferromagnetic electrodes are calculated as isolated bulk material whose electron density is given by the Kohn-Sham single-particle states:

$$\rho(r) = \sum_i f(E_i)|\Psi_i|^2$$

where f(E) is a Fermi-Dirac distribution.

Using the Fermi-Dirac distribution, it is assumed that the left and right ferromagnetic leads are in equilibrium contact with their corresponding reservoirs. The $k_\parallel$-dependent retarded self-energies of each lead are determined. In constructing the self-energies and potential matrices for each lead, the reference spin is rotated to specify the relative magnetic orientation (for example parallel or antiparallel) of the two ferromagnetic leads.

The parts of the Hamiltonian corresponding to the central region are calculated self-consistently using the non-equilibrium electron density matrix, calculated over the 2D (in the x-y direction) Brillouin zone (BZ) for contributions of each transverse Bloch state. Finally, the spin currents (spin-polarized charge currents) are calculated by integrating the contributions from each transverse Bloch state using the Landauer formula:

$$I_\sigma = \frac{2e^2}{h} \int_{BZ} dk_{//} \int d\varepsilon [f(\varepsilon - \mu_L) - f(\varepsilon - \mu_R)] \times T_\sigma(\varepsilon, k_{//})$$

where each quantity in the right-hand side is defined in spin space, with the spin index in the transmission coefficient and the current.

As people in the art will appreciate, the introduction of x-y periodicity dramatically increases the number of calculation steps compared to a 1D device. First, there are significantly more interacting unit cells in the x-y direction, even with nearest-cell interaction. Second, there is an additional k integration for the calculation of the density matrix and the current. For magnetic tunnel junctions, a huge number of $k_\parallel$ is necessary to converge the results.

Therefore, in contrast with methods for 1D devices, where there is no Brillouin zone (BZ), the present method comprises computing the scattering of incoming states from the 3D leads, by covering the entire 2 dimensional x-y Brillouin zone (BZ) through careful k-sampling. Because of BZ, the density matrix becomes functions of $k_x-k_y=k_\parallel$, and for each values of $k_x-k_y$, the method computes the density matrix and then adds them up, using DFT self-consistent loop. Thus, for example, to compute 100*100 $k_x-k_y$ values, 10,000 density matrices are needed and added up to obtain the final density matrix for one energy value. Then a large number of energy values are computed. The process is repeated during the self-consistent loop in the NEGF-DFT. These is extremely time consuming, and that's why a parallel computation is done.

Because of BZ, transmission function becomes extremely complicated in $k_x-k_y$ space. Namely, in the step 130 below, the $k_x-k_y$ dependence is extremely complicated for spin transport and one must take great care to calculate this dependence accurately.

Because of BZ, all quantities become functions of $k_x-k_y$, for example the self-energy. Thus all of them become more difficult to calculate for similar reasons as above.

To expand the electronic wave functions and construct the matrix elements of the retarded Green's function in $k_\parallel$ space, an atomic orbitals basis set is used for the DFT, wherein the atomic cores are defined by standard norm-conserving non-local pseudopotentials. Special care must be given to the pseudopotentials and basis sets in order to obtain an accurate description of the band structure near the Fermi level, which is particularly important in studying spin-polarized transport. On the one hand, the calculation of the Green's function requires a reasonable sized basis set, while on the other hand a small basis set does not give accurate results. Therefore a reasonable compromise should be adopted. Pseudopotentials and basis sets that accurately reproduce the electronic structure of the electrode and barrier material are found no to necessarily reproduce the electronic structure of the more complicated electrode/barrier interface. Therefore, these inputs are carefully constructed to accurately reproduce electronic structures of the bulk materials and interfaces.

Therefore for DFT, standard norm-conserving pseudopotentials are used and numerical orbitals are used as a basis set. Fine real space discretization is used. In the NGEF-DFT self-consistent calculation of the density matrix, a complex energy contour integration with a number of points is necessary at zero bias, plus energy points along real energy axis in the bias window when $V_b$ is nonzero. A number of k points are used to sample the Brillouin zone for each energy points for converging the density matrix. Dense k sampling is necessary to obtain accurate results.

Figure 4:
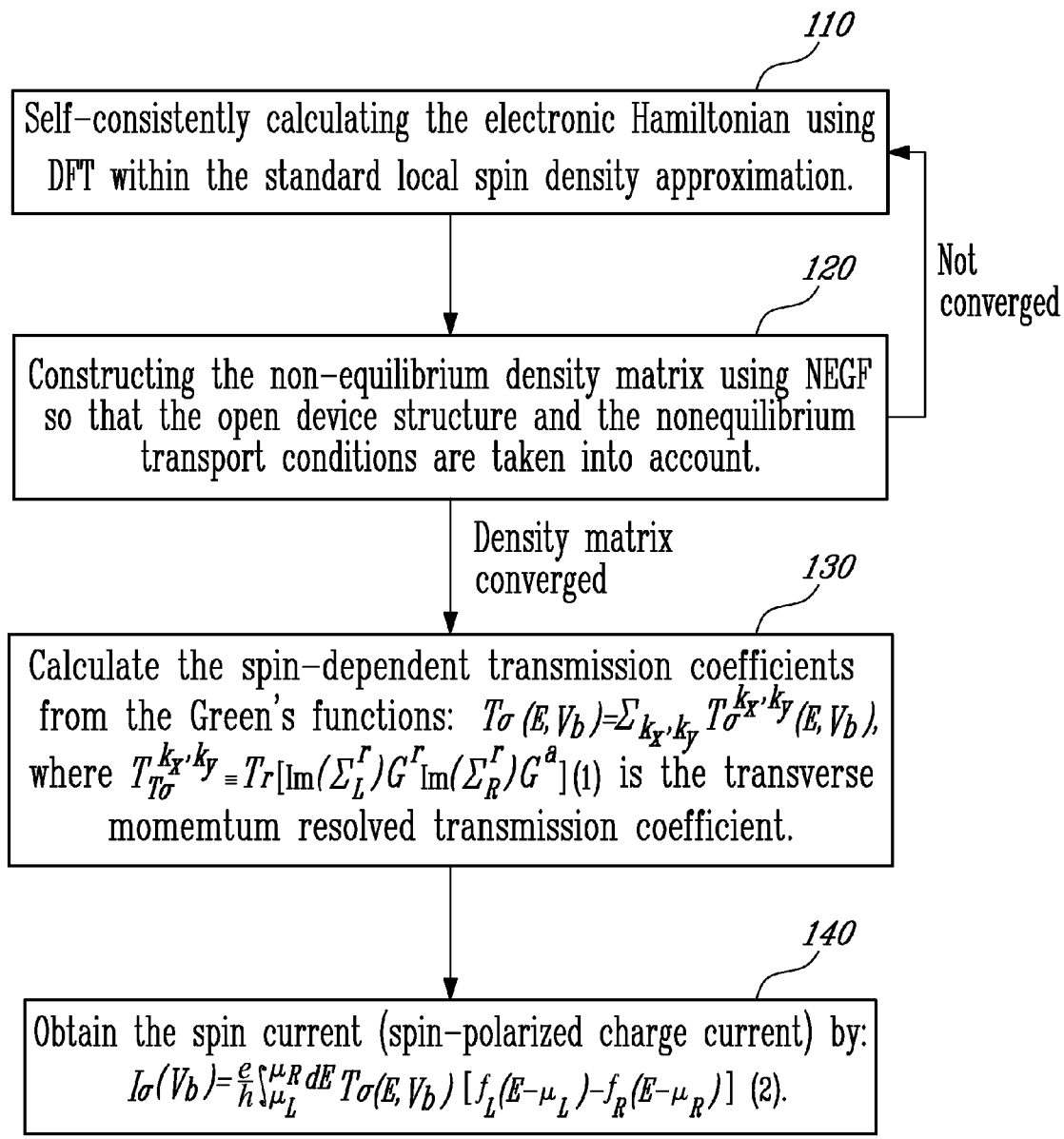
FIG. 4 is a flowchart of a method according to an embodiment of an aspect of the present invention.

As generally summarized in FIG. 4, the present method comprises self-consistently calculating the electronic Hamiltonian of the device by using DFT within the standard local spin density approximation (step 110); constructing the non-equilibrium density matrix using NEGF so that the open device structure and the nonequilibrium transport conditions are taken into account (Step 120). After the NEGF-DFT self-consistent iteration is converged, the spin-dependent transmission coefficients are calculated from the Green's functions as known in the art (step 130):

$$T_\sigma(E, V_b) = \sum_{k_x,k_y} T_\sigma^{k_x,k_y}(E, V_b), \text{ where} \quad (1)$$

$$T_{T_\sigma}^{k_x,k_y} \equiv Tr\left[\text{Im}\left(\sum_L^r\right) G^r \text{Im}\left(\sum_R^r\right) G^a\right]$$

is the transverse momentum resolved transmission coefficient.

All quantities in Equation (1) are functions of transverse momentum. Here $\sigma \equiv \uparrow, \downarrow$ is the spin index; $G^{r,a}$ are the retarded (advanced) Green's function matrices in spin or orbital space; and $$\sum_{L,R}^r$$

are the retarded self-energies due to the existence of the bulk -3D left (right) leads. $T_\sigma(E, V_b)$ depends on $V_b$ because the quantities on the right-hand side of Equation (1) follow from the $V_b$ and spin-dependent self-consistent Kohn-Sham potentials.

Finally, the spin current (spin-polarized charge current) is obtained by (see Landauer formula hereinabove):

$$I_\sigma(V_b) = \frac{e}{h}\int_{\mu_L}^{\mu_R} T_\sigma(E, V_b)[f_L(E - \mu_L) - f_R(E - \mu_R)]dE$$

where $\mu_{R,L}$ is the electrochemical potential of the left (right) leads and $\mu_L - \mu_R = eV_b$; $f_{L,R}(E - \mu_{R,L})$ are the Fermi functions The total charge current is given by $I \equiv I_\uparrow + I_\downarrow$.

TMR is obtained from the total currents as TMR= $(I_{parrallel} - I_{antiparrallel})/I_{antiparrallel}$.

In step 110, for DFT, standard norm-conserving pseudo-potentials are used and numerical orbitals are used as a basis set. Fine real space discretization is used.

In step 120, effects of an external bias voltage $V_b$ is included in the NEGF so that the density matrix is a function of $V_b$. In the NGEF-DFT self-consistent calculation of the density matrix, a complex energy contour integration with a number of points is necessary at zero bias, plus energy points along real energy axis in the bias window when $V_b$ is nonzero. A number of k points are used to sample the Brillouin zone for each energy points for converging the density matrix. Denser k sampling is necessary to obtain accurate results.

FIG. 5 show spin-polarized transport calculations of a Ni—BDT-Ni molecular TMR device using the present method. A Ni-1, 4-benzenedithiolate (BDT)-Ni device was used as an example, as schematically shown in FIG. (5a) in which the BDT is in contact with two semi-infinite Ni (100) surfaces having periodic x-y extent.

Figure 5A:
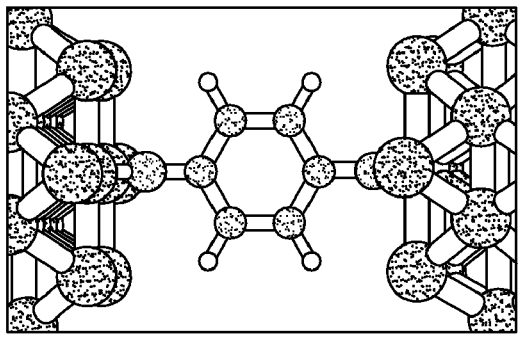
FIG. 5 show spin-polarized transport calculations of Ni—BDT-Ni molecular TMR device (FIG. 5a) using the present method.
FIG. 5b: TMR ratio versus bias voltage for hollow site binding—Inset: TMR for bridge site bonding.
FIG. 5c: I-V curves for PC set up of the leads' magnetization—Solid line: total current; dashed line: $I_\uparrow$; dotted line: $I_\downarrow$.
FIG. 5d: I-V curves for APC (antiparallel configuration) setup; Inset: spin-injection coefficient $\eta$ coefficient versus bias voltage $V_b$—solid line: APC; dashed line: PC (parallel configuration)
Figure 5B:
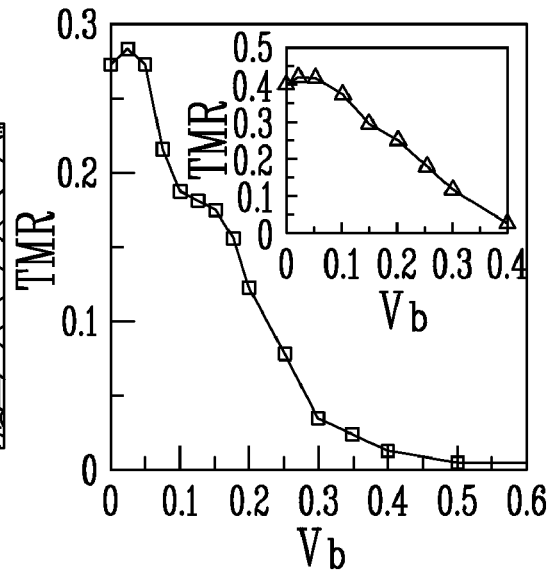

For the Ni—BDT-Ni device, the TMR ratio is found to decline from about 27% at small bias voltages to essentially zero at bout 0.5 V (FIG. 5b). Such a quench of TMR ratio by bias voltage is also seen in experimental data although the experimental device involved more than one molecule (K. Tsukagoshi, B. W. Alphenaar and H. Ago, Nature, 401, 572 (1999); Z. H. Xiong, Di Wu, Z. Valu Vardeny and Jing Shi, Nature, 427, 821 (2004); J. R. Petta, S. K. Slater and D. C. Ralph, Phys. Rev. Lett. 93, 136601 (2004).).

Figure 5C:
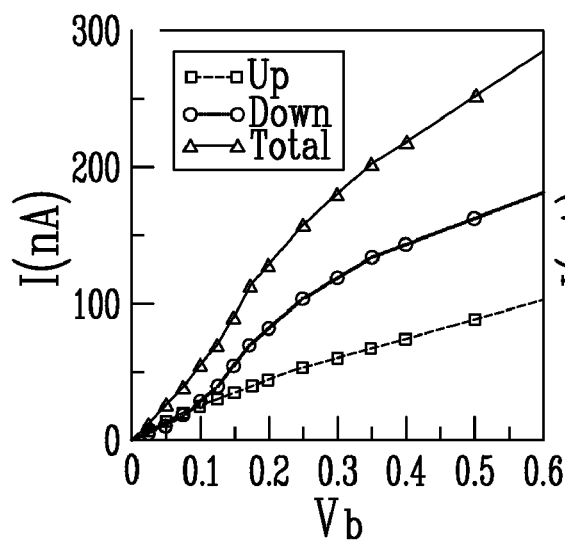
Figure 5D:
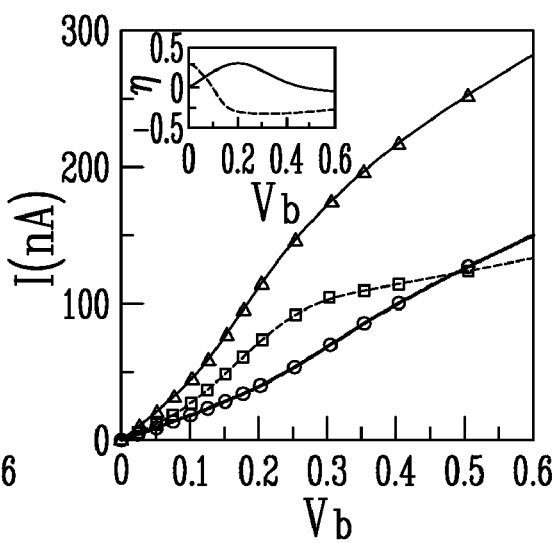
Figure 6A:
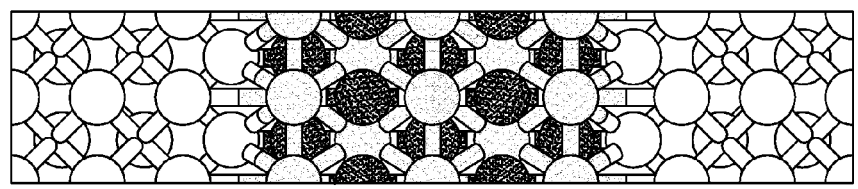
FIG. 6a: schematical illustration of the MTJ—FIGS. b) and c) I-V curves for 5-layer PC and APC, respectively. diamonds: total current; squares: $I_\uparrow$ circles: $I_\downarrow$; insets: I-V curves for small ranges of $V_b$.
Figure 6B:
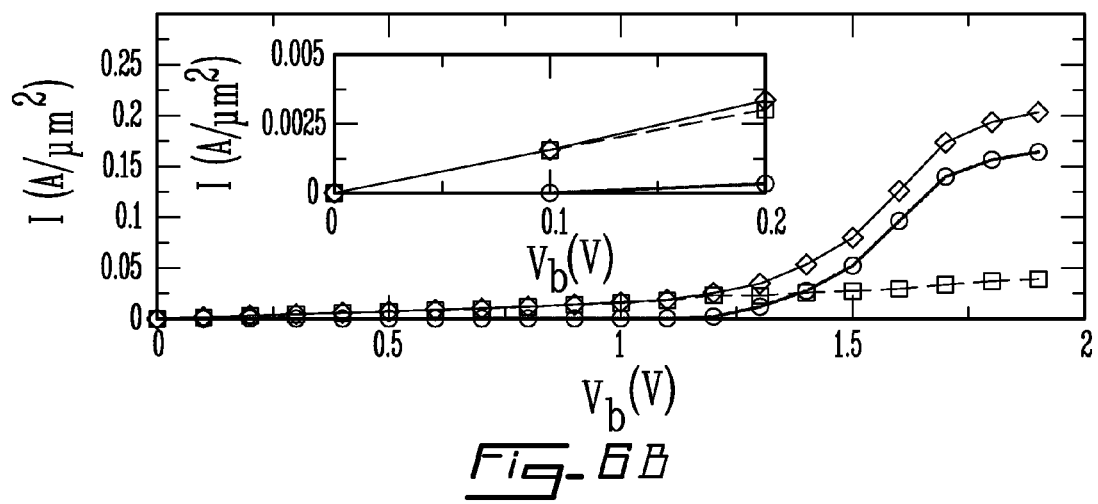
FIG. 6 shows calculation of spin-polarized quantum transport in Fe—MgO—Fe MTJ devices using the present method.
FIG. 6d: TMR vs. bias $V_b$ for a 5-layer device (diamond).
Figure 6C:
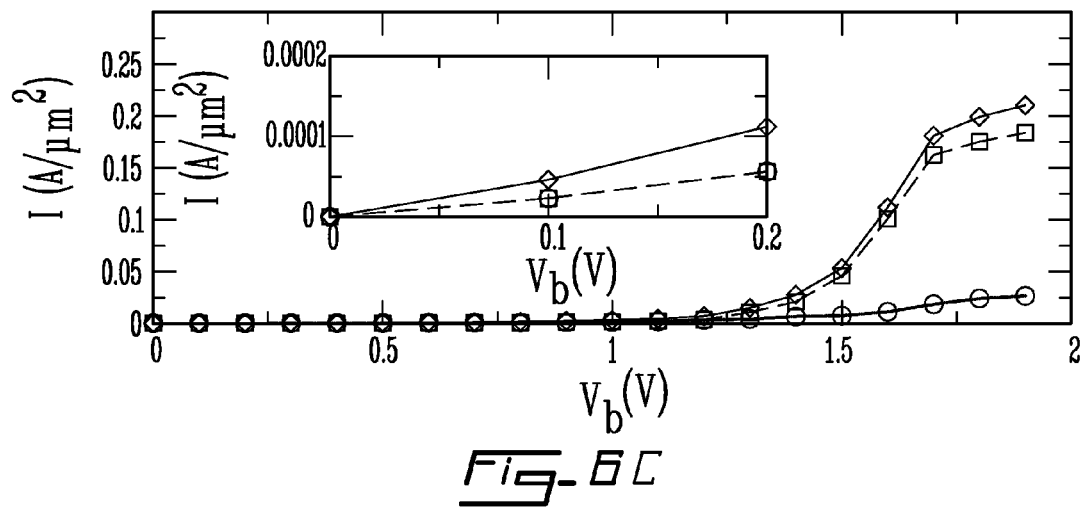
Figure 6D:
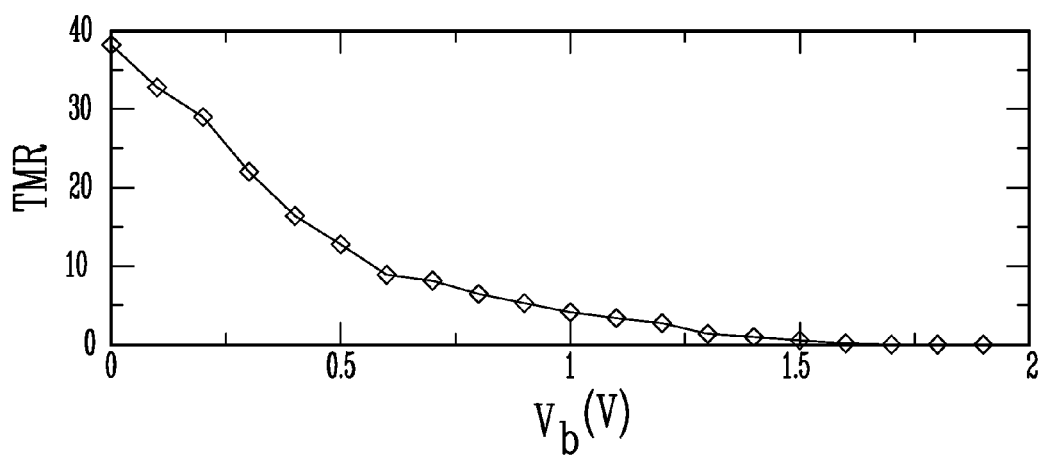

As shown in FIGS. 5c and 5d, as a function of bias, the spin current is found to vary nonlinearly: up and down spin currents can be larger or smaller than each other, and a change of sign of spin-injection occurs, due to transport resonances mediated by a combination of molecular states and the Ni surface electronic structure.

Therefore, the voltage decay scale of the TMR (FIG. 5b), the TMR ratio (FIG. 5d), and the I-V curves (FIGS. 5a,c) are all very similar to data measured in existing molecular spintronics devices.

These and other results obtained by the present NEGF-DFT-LSDA (GGA) method are proof that the present method has quantitatively captured the essential physics of TMR devices.

There is further provided a calculator, implementing the method of the present invention. In an embodiment, this calculator has been implemented in Matlab™, with time critical portions of the code written in Java™, under the appellation MATDCAL (Matlab™-based Device Calculator). In order to facilitate parallel computing within Matlab™, a high-performance parallel computing toolbox for Matlab™ was developed by wrapping a third-party implementation of MPI2.0 libraries.

MATDCAL has a large set of features, including the following: 1) electronic and magnetic structure calculations of bulk systems and XY-periodic two-probe devices; 2) band structure calculations of bulk systems; 3) equilibrium and non-equilibrium spin-dependent density matrix and density of states calculations; 4) spin-dependent transmission, spin-current, and IV-curve calculations of XY-periodic two-probe devices under finite bias voltage; 5) spin-dependent scattering states of two-probe devices under finite bias voltage; and 6) a comprehensive analysis library for extracting spin polarized quantum transport features from the NEGF-DFT/LSDA/GGA calculations, as well as many analysis tools for calculating other quantum transport features of nanoelectronic devices such as capacitances, time dependent transients, non-linear conductance coefficients, admittance, impedance, etc.

In addition to calculating spin-dependent characteristics, MATDCAL also implements the regular DFT-NEGF formalism, and is thus capable of non-spin electron quantum transport in nanostructures. MATDCAL has been extensively tested and can now be considered a mature research code. It has already been used to perform a state-of-the-art calculation of the Tunneling Magnetoresistance Ratio (TMR) and spin currents in a Magnetic Tunnel Junction (MTJ) under finite bias voltage. ("Nonlinear spin-current and magnetoresistance of molecular tunnel junctions", Derek Waldron, Paul Haney, Brian Larade, Allan MacDonald and Hong Guo, Phys. Rev. Lett. 96, 166804 (2006). "First principles modeling of tunnel magnetoresistance of Fe/MgO/Fe trilayers", Derek Waldron, Vladimir Timoshevskii, Yibin Hu, Ke Xia and Hong Guo, Phys. Rev. Lett. 97, 226802 (2006); "Ab initio simulation of magnetic tunnel junctions", Derek Waldron, Lei Liu and Hong Guo, Nanotechnology, 18, 424026 (2007)).

The present calculator quantitatively and accurately models spin-polarized charge current and spin current transport in magnetic devices from atomic microscopic point of view. The magnetic devices are in the form of MNM, as described hereinabove.

So far only the present calculator has been able to accomplish this 3D simulation of such magnetic devices.

FIG. 6 shows calculation of spin-polarized quantum transport in a Fe—MgO—Fe MTJ device (FIG. a) using the present calculator. FIGS. 6(b) and (c) plot the calculated current-voltage (I-V) characteristics (solid line) for a five-layer MgO device in PC and APC, respectively. FIG. 6d shows a decrease of TMR ratio with a voltage scale of about 0.5-1.0 V, very similar to measured data (S. S. P. Parkin et al. Nature Materials, 3, 862 (2004); S. Yuasa et al., Nature Materials, 3, 869 (2004)). In addition, the gap in I-V curve is about one volt, also in agreement with the measured results (W. Wulfhekel, et al., Appl. Phys. Lett. 78, 509 (2001)). All the obtained voltage scales for transport features are consistent with experimental data.

For the 3D left magnetic electrode, which is a periodic atomic structure in 3-dimensional space, the calculator computes its electronic structure using DFT at equilibrium. The electronic structure (potential, overlap matrix, Hamiltonian matrix, etc) is stored into a left-lead database. The same is done for the 3D right magnetic electrode and stored in a right-lead database.

Then the calculator shifts the electrode potential by an amount determined by the external bias voltage. The electrostatic potential of the scattering region is determined by the NEGF-DFT self-consistent procedure.

For a given magnetic configuration of the two electrodes (say they are parallel), the calculator starts from any initial spin-resolved nonequilibrium density matrix and construct an initial device Hamiltonian H.

Using the H, the calculator computes the NEGF of the scattering region of the device for the given magnetic configuration of the two electrodes. From the obtained NEGF, the calculator calculates a new spin-resolved nonequilibrium density matrix.

Using this spin-resolved nonequilibrium density matrix, the calculator constructs a new H. The calculator repeats this process until "self-consistency". Here, self-consistency means the new H and the old H defer by only a tiny amount that is pre-specified.

When self-consistency is obtained, the calculator proceeds to compute transport properties for the device in the specified magnetic configuration of the two electrodes (here, for example, they are parallel). These include the spin-resolved transmission coefficients, spin polarized charge current, spin-current, spin resolved scattering states, spin transfer torque etc.

The calculator then changes the magnetic configuration of the electrodes (say to anti-parallel), and for this new magnetic configuration of the two electrodes (anti-parallel), the calculator starts again and constructs an initial device Hamiltonian H, so that transport properties of the different magnetic configurations are obtained.

When devices with both parallel and anti-parallel 3D magnetic configurations of the electrodes are simulated, the calculator then obtains important device merits such as tunnel magnetoresistance ratio, spin injection coefficient, etc. It is very important to have both parallel and anti-parallel 3D magnetic configurations done in a self-consistent manner as described, otherwise these important device merits cannot be obtained.

When necessary, other magnetic configurations (e.g., the two magnetic moments of the two electrodes are at an angle to each other) can be modeled in similar fashion with an additional local rotation of magnetic moment.

The present invention has therefore a large potential application in several markets. On the one hand, it is most useful for researchers in nanoelectronics, nanotechnology, device technology, information technology, spintronics, quantum transport modeling, and materials. On the other hand, it is useful for R&D in magnetic storage and magnetic device industry, magnetic sensors, and in spintronics, emerging as a branch of nanoelectronics industry.

The present method allows accurate modeling of magnetic atoms involving larger basis sets, small lattice constants, which means that large scale computation must be handled, which are efficiently parallelized to run in a parallel computing environment. The method provided is a very powerful and versatile method based on the NEGF-DFT-LSDA/GGA formalism for predicting spin polarized quantum transport.

As should now be apparent to people in the art, the present invention provides a modeling method based on atomistic and quantum mechanical first principles, for quantitative modeling of spin-polarized charge transport in magnetic devices. The method can be applied to calculate spin polarized charge transport driven by external electric fields, and provides 1) a theoretical formulation in spin space so that the non-equilibrium density matrix can be evaluated for different spin channels; 2) a new way to perform very careful transverse momentum sampling for magnetic materials which serve as the device electrodes; and 3) an efficient parallelization of computing algorithms to accurately model a large number of atoms.

As people in the art will appreciate, in contrast to Layer-KKR method, the present method is not limited for application in systems consisting of layers of materials and requires reduced computational time while allowing modeling a bias and gate voltage.

As people in the art will appreciate, in contrast to LMTO method, the present method is not limited to bulk materials (or layered bulk materials) without external bias or gate voltage. The present method does not rely on the atmospheric sphere approximation (ASA).

As people in the art will appreciate, the present invention, since it is based on Green's functions, is extensible to many physical situations whose theoretical analyses require Green's functions.

The present method allows performing ab-initio atomistic calculations of spin polarized charge transport in realistic 3-dimensional devices under externally applied electric fields.

Although the present invention has been described hereinabove by way of specific embodiments thereof, it can be modified, without departing from the nature and teachings of the subject invention as defined in the appended claims.

What is claimed is:
1. A method for calculating spin polarized quantum transport in a 3-dimensional nanoelectronic device under non-equilibrium conditions at finite bias voltage, comprising the steps of:
  a) determining parameter of an atomic structure and electronic states at non-equilibrium of the device by self-consistently obtaining an Hamiltonian H of the device using density function theory (DFT) within a standard local spin density approximation for open device structures using a calculator;

b) evaluating a non-equilibrium density matrix for different spin channels of the device using Keldysh non equilibrium Green's functions in spin space;

c) sampling a transverse momentum of the Brillouin zone for contribution of each transverse Bloch state in directions perpendicular to the current flow for converging the density matrix; and d) calculating spin-dependent transmission coefficients from the Green's functions, wherein calculating the spin-dependent transmission coefficients from Green's functions is calculated as: $T_\sigma(E, V_b) = \Sigma k_x, k_y T_\sigma^{kx,ky}(E, V_b)$, where $T_{T\sigma}^{kx,ky} \equiv Tr[Im(\Sigma^r L)G^r Im(\Sigma^r R)G^a]$ is a transverse momentum resolved transmission coefficient; and obtaining spin-polarized charge current as: $I_\sigma(V_b) = e/h \int_{\mu_L}^{\mu_R} T_\sigma(E,V_b)[f_L(E-\mu_L) - f_R(E-\mu_R)]dE$ where $\mu_{R,L}$ is an electrochemical potential of the left/right leads and $\mu_L - \mu_R = eV_b$; $f_{L,R}(E-\mu_{R,L})$ are Fermi functions;

wherein said transverse momentum sampling allows obtaining bulk and surface magnetism of magnetic materials serving as electrodes for the device.

2. The method of claim 1, comprising incorporating one of i) local spin density functional (LSDA) and ii) generalized gradient approximation (GGA).

3. The method of claim 1, wherein in said step a) the density function theory (DFT) is applied using standard norm-conserving pseudopotentials and atomic orbitals are used as a basis set for electronic wavefunctions.

4. The method of claim 1, further comprising calculating a total charge current as: $I = I\uparrow + I\downarrow$.

5. The method of claim 4, further comprising obtaining a tunnelling magnetoresistance ratio (TMR) from the total charge current as:
TMR $=(I_{parrallel} - I_{antiparrallel})/I^{antiparallel}$.

6. A method for calculating spin polarized quantum transport in a 3-dimensional nanoelectronic device under non-equilibrium conditions at finite bias voltage, comprising the steps of:

self-consistently obtaining an Hamiltonian H for an open device using density function theory (DFT);

obtaining an electronic structure of the device by using a non-equilibrium Green's function (NEGF) to handle nonequilibrium statistics, and device transport boundary conditions using a real space numerical technique; and implementing local spin density functional and generalized gradient approximation for nonequilibrium non-equilibrium Green's function (NEGF) and density function theory (DFT) calculations calculating spin-dependent transmission coefficients from the Green's functions, wherein calculating the spin-dependent transmission coefficients from Green's functions is calculated as: $T_\sigma(E, V_b) = \Sigma K_x, k_y T_\sigma^{kx,ky}(E, V_b)$, where $T_{T\sigma}^{kx,ky} \equiv Tr[Im(\Sigma^r_L)G^r Im(\Sigma^r_R)G^a]$ is a transverse momentum resolved transmission coefficient; and obtaining spin-polarized charge current as: $I_{\sigma(Vb)} = e/h \int_{\mu_L}^{\mu_R} T_\sigma(E,V_b)[f_L(E-\mu_L) - f_R(E-\mu_R)]dE$ where $\mu_{R,L}$ is an electrochemical potential of the left/right leads and $\mu_L - \mu_R = eV_b$; $f_{L,R}(E-\mu_{R,L})$ are Fermi functions, wherein a transverse momentum sampling allows obtaining bulk and surface magnetism of magnetic materials serving as electrodes for the device.

7. The method of claim 6, wherein for the density function theory (DFT), standard norm-conserving pseudopotentials are used and numerical orbitals are used as a basis set.

\* \* \* \* \*